(12) United States Patent
Seino (10) Patent No.: US 11,091,726 B2
(45) Date of Patent: Aug. 17, 2021

(54) COMPOSITION FOR REMOVING PHOTORESIST RESIDUE AND/OR POLYMER RESIDUE

(71) Applicant: Kanto Kagaku Kabushiki Kaisha, Tokyo (JP)

(72) Inventor: Yasuyuki Seino, Soka (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/510,810

(22) PCT Filed: Oct. 30, 2015

(86) PCT No.: PCT/JP2015/080739
§ 371 (c)(1),
(2) Date: Oct. 18, 2017

(87) PCT Pub. No.: WO2016/068290
PCT Pub. Date: May 6, 2016

(65) Prior Publication Data
US 2018/0051237 A1    Feb. 22, 2018

(30) Foreign Application Priority Data
Oct. 31, 2014  (JP) .............................. JP2014-223642

(51) Int. Cl.
| | | |
|---|---|---|
| C11D 11/00 | (2006.01) | |
| H01L 21/3213 | (2006.01) | |
| H01L 21/02 | (2006.01) | |
| C11D 3/00 | (2006.01) | |
| C11D 7/08 | (2006.01) | |
| C11D 7/10 | (2006.01) | |
| C11D 7/26 | (2006.01) | |
| C11D 7/32 | (2006.01) | |
| C11D 7/50 | (2006.01) | |
| C23F 1/14 | (2006.01) | |

(52) U.S. Cl.
CPC ........ *C11D 11/0047* (2013.01); *C11D 3/0073* (2013.01); *C11D 7/08* (2013.01); *C11D 7/10* (2013.01); *C11D 7/261* (2013.01); *C11D 7/32* (2013.01); *C11D 7/5022* (2013.01); *C23F 1/14* (2013.01); *H01L 21/02071* (2013.01); *H01L 21/32138* (2013.01)

(58) Field of Classification Search
CPC . H01L 21/32138; C11D 11/0047; C11D 7/32; C11D 7/5022; B08B 3/08
See application file for complete search history.

(56) References Cited

U.S. PATENT DOCUMENTS

| | | | |
|---|---|---|---|
| 2005/0064640 A1* | 3/2005 | Park | .................. H01L 29/66651 438/197 |
| 2006/0154839 A1 | 7/2006 | Ilardi et al. | |
| 2008/0169004 A1 | 7/2008 | Wu | |
| 2010/0048443 A1* | 2/2010 | Ohwada | ................... G03F 7/426 510/176 |
| 2014/0109931 A1 | 4/2014 | Lee et al. | |

FOREIGN PATENT DOCUMENTS

| | | | |
|---|---|---|---|
| EP | 1063689 A1 | 12/2000 | |
| JP | H11-174690 | 7/1999 | |
| JP | H11-316464 | 11/1999 | |
| JP | 2000-206709 | 7/2000 | |
| JP | 2000-232063 | 8/2000 | |
| JP | 2000-260761 | 9/2000 | |
| JP | 2001-051429 | 2/2001 | |
| JP | 2001-100436 | 4/2001 | |
| JP | 2002-176041 | 6/2002 | |
| JP | 2002357908 A * | 12/2002 | |
| JP | 2003-223010 | 8/2003 | |
| JP | 2004-094034 | 3/2004 | |
| JP | 2004-511917 | 4/2004 | |
| JP | 2004-205674 | 7/2004 | |
| JP | 2004-239966 | 8/2004 | |
| JP | 2007-503115 | 2/2007 | |
| JP | 2008-198994 | 8/2008 | |
| JP | 2014-84464 | 5/2014 | |
| TW | 201333171 A1 | 8/2013 | |
| WO | WO 2002/33033 A1 | 4/2002 | |
| WO | WO 2013/101907 A1 | 7/2013 | |
| WO | WO-2014089196 A1 * | 6/2014 | ........... C11D 3/0073 |

OTHER PUBLICATIONS

Machine translation: JP2002-357908A; Yokoi, S. (Year: 2002).*
Office Action for Taiwan Application No. 104135802, dated Mar. 18, 2019.

* cited by examiner

*Primary Examiner* — Natasha N Campbell
(74) *Attorney, Agent, or Firm* — Wolf, Greenfield & Sacks, P.C.

(57) ABSTRACT

To provide a composition for removing photoresist residue and/or polymer residue formed in a process for producing a semiconductor circuit element, and a removal method employing same. A composition for removing photoresist residue and/or polymer residue, the composition containing saccharin and water, and the pH being no greater than 9.7.

10 Claims, 1 Drawing Sheet

Prior Art

COMPOSITION FOR REMOVING PHOTORESIST RESIDUE AND/OR POLYMER RESIDUE

RELATED APPLICATIONS

This application is a national stage filing under 35 U.S.C. § 371 of International Application No. PCT/JP2015/080739, filed Oct. 30, 2015, entitled "Composition for Removing Photoresist Residue and/or Polymer Residue," the entire content of which is incorporated by reference herein in its entirety.

TECHNICAL FIELD

The present invention relates to a composition for removing photoresist residue and/or polymer residue remaining after dry etching or wet etching or after ashing in a process for producing a semiconductor circuit element having metal wiring, and to a method for removing residue using the same.

BACKGROUND ART

In a process for producing a semiconductor circuit element having metal wiring, a composition containing an inorganic alkali, an organic alkali, an inorganic acid, an organic acid, an inorganic acid salt, an organic acid salt, etc. as a main material that is mixed with water, a water-soluble solvent, a complexing agent, a chelating agent, a surfactant, etc. is used as a composition for removing photoresist residue and/or polymer residue remaining after dry etching and after ashing.

As the composition for removing photoresist residue and/or polymer residue remaining after dry etching or after ashing, a composition containing an amine-based compound is often used. However, when the content of an amine-based compound or water is high, corrosion of metal wiring or a metal thin film of aluminum, tungsten, etc. on a substrate easily occurs, and there is the problem that a metal surface is corroded. Furthermore, when washing with water is carried out immediately after treatment with a chemical, the action between an amine-based compound and water produces a strong alkali, and a metal wiring material is sometimes corroded. This can be dealt with by carrying out intermediate rinsing with isopropyl alcohol, etc. prior to washing with water, but the operating steps increase in number and become complicated.

As a composition that can solve these drawbacks, Patent Document 1 reports an aqueous solution composition in which an alkanolamine and an organic acid are mixed, Patent Document 2 reports an aqueous solution composition containing phosphoric acid and a primary to quaternary amine, Patent Documents 3 and report an aqueous solution composition containing an amine that have a chelating effect and an acid and a salt thereof, and Patent Document 5 reports a composition containing piperazine.

Other than the above, Patent Document 6 reports an aqueous solution composition containing at least one type selected from an aliphatic polycarboxylic acid, a salt thereof, an aminopolycarboxylic acid, and a salt thereof, Patent Document 7 reports an aqueous solution composition containing a polycarboxylate and glycol ether, and Patent Document 8 reports an aqueous solution composition containing an organic acid and/or a salt thereof and an organic solvent. Patent Document 9 reports an aqueous solution composition containing ammonium phosphate.

A composition containing a fluoride such as hydrofluoric acid or ammonium fluoride has excellent removability for residue containing a metal oxide. With regard to the composition containing a fluoride, Patent Document 10 reports an aqueous solution composition containing ammonium fluoride, a polar solvent, and an acidic compound corrosion inhibitor, Patent Document 11 reports a composition containing a fluorine compound and an ether solvent, and Patent Document 12 reports a composition containing a fluorine compound, a hydroxycarboxylic acid ester, and water.

On the other hand, Patent Document 13 describes a highly alkaline microelectronics substrate cleaning composition with a pH exceeding 11.5 that contains saccharin as a bath stabilizer.

Furthermore, Patent Documents 14 and 15 describe a semiconductor substrate cleaning liquid containing a fluoride, saccharin acid being described as one example of a possible chelating agent that promotes dissolution of a metal residue.

Patent Document 16 describes a microelectronics cleaning liquid having as essential components at least one type of ammonium and quaternary ammonium ion, hypophosphorous acid, and a phosphorous acid ion, with saccharin acid being described as one example of a corrosion inhibitor. However, neither of the publications examine compositions containing saccharin acid in detail.

PRIOR ART DOCUMENTS

Patent Documents

[Patent Document 1] JP, A, 11-174690
[Patent Document 2] JP, A, 2002-176041
[Patent Document 3] JP, A, 2003-223010
[Patent Document 4] JP, A, 2001-51429
[Patent Document 5] JP, A, 2004-205674
[Patent Document 6] JP, A, 11-316464
[Patent Document 7] JP, A, 2004-94034
[Patent Document 8] JP, A, 2000-206709
[Patent Document 9] JP, A, 2000-232063
[Patent Document 10] JP, A, 2000-260761
[Patent Document 11] JP, A, 2001-100436
[Patent Document 12] JP, A, 2004-239966
[Patent Document 13] JP, A, 2014-84464
[Patent Document 14] JP, A (PCT) 2004-511917
[Patent Document 15] JP, A, 2008-198994
[Patent Document 16] JP, A (PCT) 2007-503115

SUMMARY OF THE INVENTION

Problems to be Solved by the Invention

In the conventional techniques described above, there are the problems that residue removability is sometimes not sufficient and metal wiring is corroded, and a fully satisfactory composition has not yet been obtained when focusing on residue removability and inhibiting corrosion of each material.

For example, the composition described in Patent Document is insufficient in terms of inhibiting corrosion of metal wiring, the compositions described in Patent Documents 2 to 5 are insufficient in terms of residue removability and inhibiting corrosion of metal wiring, and the compositions described in Patent Documents 6 to 8 are insufficient in terms of residue removability. The composition described in Patent Document 9 is desirable in terms of workability since it does not contain a hazardous substance or a toxic substance and does not fall under the category of hazardous materials, but when focusing on residue removability and inhibiting corrosion of metal wiring its properties are not sufficient. The compositions described in Patent Documents 10 to 12 are also not satisfactory in terms of inhibiting corrosion of metal wiring.

Therefore, it is an object of the present invention to solve the above problems and provide a composition for removing photoresist residue and/or polymer residue formed in a process for producing a semiconductor circuit element having metal wiring, a method for removing photoresist residue and/or polymer residue using the composition, a method for producing a semiconductor circuit element having metal wiring that includes a step in which the removal method is employed, and a semiconductor circuit element produced by the production method.

Means for Solving the Problems

While carrying out an intensive investigation in order to solve the above problems, the present inventors have confronted the problem that, although a composition containing an appropriate combination of water, a water-soluble solvent, an acid, and a dissociable nitrogen-containing compound is effective for removing photoresist residue and/or polymer residue remaining after forming wiring of various types of metal, the residue removability can be insufficient or the metal wiring material might be corroded.

As a measure therefor, the present inventors have found that adding saccharin to a solution, in particular at a pH of no greater than 9.7, enables the removability of photoresist residue and/or polymer residue to be greatly improved without corroding a metal wiring material, and as a result of further investigation the present invention has been accomplished.

That is, the present invention relates to the following.
[A1] A composition for removing photoresist residue and/or polymer residue, the composition comprising saccharin and water, and the pH being no greater than 9.7.
[A2] The composition according to [A1], wherein it further comprises one or more types of substance selected from the group consisting of (A) a water-soluble solvent, (B) an acid, and (C) a dissociable nitrogen-containing compound.
[A3] The composition according to [A1] or [A2], wherein the content of saccharin is at least 0.01 mass %.
[A4] A method for removing photoresist residue and/or polymer residue, the method employing the composition according to any one of [A1] to [A3].
[A5] A method for producing a semiconductor circuit element having metal wiring, the method comprising a step of removing photoresist residue and/or polymer residue remaining on a metal wiring-forming structure using the composition according to any one of [A1] to [A3].
[A6] A semiconductor circuit element produced by the method according to [A5].

Effects of the Invention

In accordance with the present invention, adding saccharin to a composition for removing photoresist residue and/or polymer residue, in particular at a pH of no greater than 9.7, enables the removability of photoresist residue and/or polymer residue after dry etching or wet etching to be outstandingly improved, and the selectivity between removal of residue and etching of a metal wiring material becomes high. That is, saccharin not only has the ability to remove photoresist residue and/or polymer residue containing a polymer component as an active ingredient but also suppresses corrosion of Al—Cu, etc. when removing residue, and improves the state of Al—Cu, etc. It is possible, by carrying out a wet treatment using the composition containing saccharin related to the present invention, to easily remove photoresist residue and/or polymer residue on a substrate without corroding a metal wiring material.

MODES FOR CARRYING OUT THE INVENTION

The present invention is explained in detail below by reference to a preferred embodiment of the present invention. In the present specification, the composition for removing photoresist residue and/or polymer residue can be used for removing photoresist residue and/or polymer residue remaining on a semiconductor substrate after carrying out etching using a photoresist as a mask and, furthermore, after carrying out ashing in a process for producing a semiconductor circuit element having metal wiring, or for removing photoresist residue and/or polymer residue remaining on a semiconductor substrate, etc. after carrying out dry etching or wet etching using an inorganic material as a mask.

In the present invention, the 'photoresist residue' means a photoresist-derived component that remains after a treatment involving photolithography with a photoresist as a mask, a treatment involving etching, and a treatment involving peeling off a photoresist mask by means of ashing, etc.

The photoresist residue includes a reaction product formed by a reaction of a photoresist due to etching or ion implantation, unreacted photoresist, and asked photoresist formed by ashing.

Furthermore, the 'polymer residue' means a deposit of the product of a reaction between a material to be etched and an etching gas, the deposit remaining as a by-product on a wall face of a material to be etched when carrying out dry etching. The polymer residue can comprise an organic substance such as a photoresist-derived polymer component, an etching gas-derived component, a material to be etched-derived component, or an inorganic substance such as a metal residue. Specific examples include a side wall polymer (also called a side wall protective film or a rabbit ear) produced when forming metal wiring, a side wall polymer produced when dry etching an interlayer insulating film, and a polymer containing an organometallic polymer and a metal oxide remaining on a side face and a bottom face of a via hole when forming the via hole.

In the present invention, the 'metal residue' includes a metal wiring material-derived component formed by etching, and examples include metals such as copper, aluminum, titanium, tantalum, tungsten, germanium, antimony, and tellurium, and oxides and halides thereof.

The composition for removing photoresist residue and/or polymer residue of the present invention contains saccharin and water and contains, as necessary, at least one type of substance selected from the group consisting of (A) a water-soluble solvent, (B) an acid, and (C) a dissociable nitrogen-containing compound. It may further contain a surfactant.

The pH of the composition for removing photoresist residue and/or polymer residue of the present invention is preferably no greater than 9.7, more preferably no greater than 9.0, and particularly preferably at least 0.0 but no greater than 9.0. From the viewpoint of residue removability, inhibition of corrosion of metal wiring material, selectivity between removal of residue and etching of metal wiring material, etc. the pH is yet more preferably at least 1.0 but no greater than 7.0. When the pH exceeds 9.8, corrosion of Al—Cu, which is a metal wiring material, easily occurs, and the residue removability is degraded.

Adjustment of pH may be carried out using ammonia, a primary amine, a secondary amine, a tertiary amine, a quaternary ammonium hydroxide, an inorganic acid, an organic acid, etc.

The content of saccharin contained in the composition for removing photoresist residue and/or polymer residue of the present invention is not particularly limited, but from the viewpoint of removability of photoresist residue and/or polymer residue and inhibition of corrosion of metal wiring material, the content of saccharin is preferably at least 0.01 mass %. For a composition containing saccharin and water, the content of saccharin is preferably 0.01 to 0.40 mass %, and more preferably 0.01 to 0.20 mass %. For a composition containing, in addition to saccharin and water, at least one type selected from the group consisting of (A) a water-soluble solvent, (B) an acid, and (C) a dissociable nitrogen-containing compound, the content of saccharin is preferably 0.01 to 20 mass %, and more preferably 0.05 to 5 mass %. Furthermore, the content of water contained in the composition for removing photoresist residue and/or polymer residue of the present invention is not limited.

Examples of the water-soluble solvent used in the composition for removing photoresist residue and/or polymer residue of the present invention include an alcohol, a glycol ether, an ester, an amide, and a lactam. Other than the above, a sulfur-containing compound such as dimethyl sulfoxide or sulfolane can also be cited. One or more types thereof may be used as a mixture.

The content of the water-soluble solvent is not particularly limited, but from the viewpoint of removability of photoresist residue and/or polymer residue and inhibition of corrosion of a metal wiring material it is preferably 1 to 99 mass %, and more preferably 1 to 50 mass %.

Examples of the alcohol include an ether group-containing alcohol such as furfuryl alcohol or tetrahydrofurfuryl alcohol, and a glycol. Examples of the glycol include ethylene glycol (1,2-ethanediol), propylene glycol (1,2-propanediol), 1,3-propanediol, diethylene glycol (3-oxapentane-1,5-diol), dipropylene glycol, 1,2-butanediol, 1,3-butanediol, 1,4-butanediol, 2,3-butanediol, glycerol (1,2,3-propanetriol), and hexylene glycol (2-methyl-2,4-pentanediol). One or more types thereof may be used as a mixture.

Among them, tetrahydrofurfuryl alcohol, propylene glycol (1,2-propanediol), hexylene glycol (2-methyl-2,4-pentanediol), or a mixture thereof is preferable.

Examples of the glycol ether include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monobutyl ether, diethylene glycol dimethyl ether, diethylene glycol diethyl ether, triethylene glycol monomethyl ether, triethylene glycol dimethyl ether, triethylene glycol monobutyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, dipropylene glycol dimethyl ether, and tripropylene glycol monomethyl ether. One or more types thereof may be used as a mixture. Among them, diethylene glycol monomethyl ether, diethylene glycol monobutyl ether, or a mixture thereof is preferable.

Examples of the ester include a carboxylic acid ester, a carbonic acid ester, a lactone, a phosphoric acid ester, and a sulfuric acid ester. One or more types thereof may be used as a mixture.

Examples of the carboxylic acid ester include methyl formate, ethyl formate, methyl acetate, ethyl acetate, methyl lactate, ethyl lactate, propyl lactate, ethyl 2-hydroxybutyrate, dimethyl malate, diethyl malate, dimethyl tartrate, diethyl tartrate, diisopropyl tartrate, and propyl tartrate. Among them, ethyl lactate is preferable.

Examples of the carbonic acid ester include dimethyl carbonate, diethyl carbonate, ethyl methyl carbonate, ethylene carbonate, and propylene carbonate. Among them, ethylene carbonate and propylene carbonate are preferable.

Examples of the lactone include γ-butyrolactone, γ-valerolactone, and δ-valerolactone. Among them, γ-butyrolactone is preferable.

Examples of the amide include acetamide, N-methylacetamide, isobutyramide, propionamide, N-ethylacetamide, malonamide, nicotinamide, and N,N-dimethylacetamide. Among them, N,N-dimethylacetamide is preferable.

Examples of the lactam include N-methyl-2-pyrrolidone and 1,3-dimethyl-2-imidazolidinone. Among them 1,3-dimethyl-2-imidazolidinone is preferable.

Examples of the acid used in the composition for removing photoresist residue and/or polymer residue of the present invention include an inorganic acid and an organic acid.

The content of the acid is not particularly limited, but from the viewpoint of the removability by the composition for removing photoresist residue and/or polymer residue and inhibition of corrosion of wiring material, it is preferably 0.001 to 90 mass %, and more preferably 0.002 to 30 mass %.

Specific examples of the inorganic acid include hydrofluoric acid, hydrochloric acid, hydrobromic acid, hydrosulfuric acid, phosphoric acid, diphosphoric acid, tripolyphosphoric acid, boric acid, iodic acid, sulfuric acid, sulfurous acid, hypochlorous acid, chlorous acid, perchloric acid, nitric acid, nitrous acid, peroxonitric acid, peroxophosphoric acid, peroxodiphosphoric acid, peroxosulfuric acid, peroxodisulfuric acid, and hydrogen peroxide. One or more types thereof may be used as a mixture. Hydrofluoric acid, phosphoric acid, diphosphoric acid, boric acid, or a mixture thereof is preferable, and hydrofluoric acid, phosphoric acid, or a mixture thereof is particularly preferable.

Specific examples of the organic acid include a carboxylic acid and a phenol. Other than the above, examples include a sulfonic acid such as methanesulfonic acid and a phosphonic acid such as nitrilotris(methylenephosphonic acid). One or more types thereof may be used as a mixture.

Specific examples of the carboxylic acid include formic acid, acetic acid, methoxyacetic acid, trifluoroacetic acid, propionic acid, butyric acid, lactic acid, malic acid, citric acid, glycolic acid, glyoxylic acid, oxalic acid, malonic acid, succinic acid, and maleic acid. One or more types thereof may be used as a mixture. Acetic acid, lactic acid, malonic acid, methoxyacetic acid, or a mixture thereof is preferable, and acetic acid, lactic acid, malonic acid, or a mixture thereof is particularly preferable.

Examples of the phenol include phenol, catechol, pyrogallol, salicylic acid, guaiacol, and gallic acid. One or more types thereof may be used as a mixture. Among them, catechol, gallic acid, or a mixture thereof is preferable.

Examples of the dissociable nitrogen-containing compound used in the composition for removing photoresist residue and/or polymer residue of the present invention include ammonia, an ammonium salt, an amine, an amine salt, a quaternary ammonium salt, and an amino acid. One or more types thereof may be used as a mixture.

The content of the dissociable nitrogen-containing compound is not particularly limited, but from the viewpoint of removability of photoresist residue and/or polymer residue and inhibition of corrosion of a wiring material, it is preferably 0.005 to 50 mass %, and more preferably 0.005 to 35 mass %.

Examples of the ammonium salt include an organic ammonium salt and an inorganic ammonium salt. Examples of the organic ammonium salt include an ammonium salt of a carboxylic acid, such as ammonium acetate, ammonium oxalate, ammonium citrate, or ammonium tartrate. Examples of the inorganic ammonium salt include ammonium sulfate, triammonium phosphate, diammonium hydrogenphosphate, ammonium dihydrogenphosphate, ammonium chloride, and ammonium fluoride. One or more types thereof may be used as a mixture. Among them, ammonium oxalate, diammonium hydrogenphosphate, ammonium fluoride, or a mixture thereof is preferable.

Examples of the amine include hydroxylamine, an alkanolamine, an alkylamine, and a cyclic amine. One or more types thereof may be used as a mixture.

Examples of the alkanolamine include monoethanolamine, isopropanolamine, diethanolamine, triethanolamine, N-methylethanolamine, N-methyldiethanolamine, N-ethyldiethanolamine, and N,N-dimethylmonoethanolamine. Among them, monoethanolamine is preferable.

Examples of the alkylamine include methylamine, dimethylamine, trimethylamine, tert-butylamine, ethylamine, diethylamine, isopropylamine, diisopropylamine, 1,1-dimethylhydrazine, N,N-dimethylethylamine, N,N-diethylmethylamine, N,N-dimethylisopropylamine, ethylenediamine, ethylmethylamine, 1,2-dimethylpropylamine, butylamine, isobutylamine, propylamine, N,N,N'N'-tetramethylethylenediamine, 1,2-diaminopropane, 1,3-diaminopropane, and N,N-dimethylethylenediamine. One or more types thereof may be used as a mixture. Among them, diisopropylamine is preferable.

Examples of the cyclic amine include imidazole, pyridine, pyrazine, pyrimidine, piperazine, morpholine, purine, and a derivative thereof. One or more types thereof may be used as a mixture. Among them, imidazole, piperazine, or a mixture thereof is preferable.

Examples of the amine salt include piperazine sulfate, hydroxylamine sulfate, guanidine phosphate, triethanolamine phosphate, piperazine phosphate, piperazine citrate, phenylhydrazine oxalate, 2-(dimethylamino)ethanol L-tartaric acid, hydrazine L-(+)-L tartrate, piperazine dihydrochloride, hydroxylamine hydrochloride, monoethanolamine hydrochloride, diethanolamine hydrochloride, and triethanolamine hydrochloride. One or more types thereof may be used as a mixture. Among them, hydroxylamine sulfate, guanidine phosphate, piperazine phosphate, or a mixture thereof is preferable.

Examples of the quaternary ammonium salt include tetramethylammonium hydroxide, tetramethylammonium fluoride, tetramethylammonium tetrafluoroborate, tetramethylammonium hexafluorophosphate, tetramethylammonium sulfate, tetramethylammonium chloride, tetramethylammonium perchlorate, tetramethylammonium acetate, tetraethylammonium hydroxide, tetraethylammonium chloride, tetraethylammonium fluoride, choline, choline chloride, choline bitartrate, triethylmethylammonium tetrafluoroborate, tetrapropylammonium hydroxide, tetrapropylammonium chloride, tetrabutylammonium hydroxide, tetrabutylammonium chloride, tetrabutylammonium hexafluorophosphate, and tetrabutylammonium tetrafluoroborate. One or more types thereof may be used as a mixture. Among them, choline bitartrate is preferable.

Examples of the amino acid include alanine, arginine, asparagine, aspartic acid, cysteine, glutamine, glutamic acid, glycine, histidine, isoleucine, leucine, lysine, methionine, phenylalanine, proline, serine, threonine, tryptophan, tyrosine, valine, citrulline, bicine, and iminodiacetic acid. One or more types thereof may be used as a mixture. Among them, glycine is preferable.

A cationic, anionic, or nonionic surfactant may be added to the composition for removing photoresist residue and/or polymer residue of the present invention. The content of the surfactant is not particularly limited, but is preferably less than 0.3 mass %.

When peeling off photoresist residue and/or polymer residue using the composition for removing photoresist residue and/or polymer residue of the present invention, the treatment temperature and the treatment time may be appropriately adjusted. The treatment temperature is adjusted so that it is within 25° C. to 70° C., and the treatment time is adjusted so that it is within 10 seconds to 30 minutes.

As a rinsing liquid after the composition for removing photoresist residue and/or polymer residue of the present invention is used, ultrapure water, a water-soluble solvent, or a mixed liquid of ultrapure water and a water-soluble solvent may be used. As the water-soluble solvent, methyl alcohol, ethyl alcohol, or isopropanol is usually used, but a water-soluble solvent other than the above may be used.

The composition of the present invention may be used for a usually used photoresist without any particular restrictions.

In one aspect, the present invention relates to a method for removing photoresist residue and/or polymer residue using the composition of the present invention.

It also relates to a method for producing a semiconductor circuit element having metal wiring, employing the above removal method, wherein it includes a step of removing photoresist residue and/or polymer residue remaining on a metal wiring-forming structure by use of the composition of the present invention.

In the present invention, the 'metal wiring-forming structure' means a structure in any stage of a metal wiring step in the production process of a semiconductor circuit element having metal wiring.

Examples include a structure in a stage after etching subsequent to photolithography, a structure in a stage after ashing, and a structure in a stage after etching subsequent to ashing. More specific examples include a structure after dry etching an interlayer insulating film, a structure after forming a via hole, and a structure shown in FIG. 1.

EXAMPLES

With regard to the composition for removing photoresist residue and/or polymer residue of the present invention, the present invention is explained in further detail by reference to Examples and Comparative Examples. The present invention should not be construed as being limited to these Examples.

Evaluation: residue removability and inhibition of corrosion of Al—Cu

Figure 1:
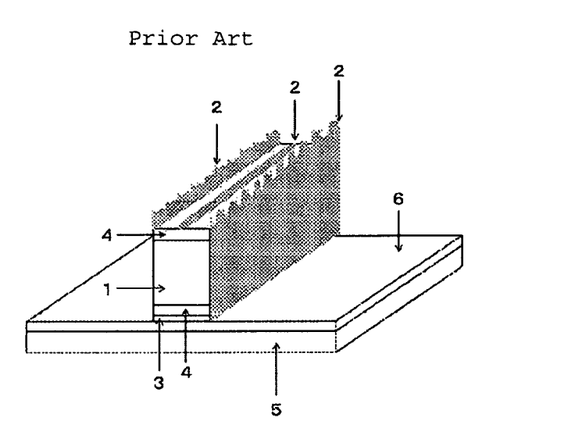
FIG. 1 is a schematic diagram of a cross section of part of Al—Cu wiring (labeled as Prior Art).

A cross section of a part of Al—Cu wiring formed on a silicon wafer by carrying out dry etching using a photoresist as a mask and removing the resist by oxygen plasma is shown in FIG. 1. The photoresist was a positive type photoresist. Photoresist residue and polymer residue (2) were attached to an upper part and a side face of Al—Cu wiring (1). A barrier metal was formed from titanium (3) and titanium nitride (4), and the substrate was formed from silicon (5) and a silicon oxide film (6). Evaluation of residue removability and inhibition of corrosion of Al—Cu was carried out using this substrate. Evaluation methods were as follows.

The substrate was immersed in the chemical liquid to be evaluated shown in Table 1, Table 2, Table 5, Table 6, Table 9, Table 10, Table 13, Table 14, Table 17, and Table 18, then rinsed with ultrapure water, and dried. It was examined using an electron microscope (SEM), and the state of the Al—Cu wiring was ascertained. Conditions of the treatment with the chemical liquid were made appropriate while taking into consideration the properties of each of the chemical liquids to be evaluated. The treatment temperature was in the range of 25° C. to 70° C., and the treatment time was in the range of 10 seconds to 30 minutes. The time for rinsing with ultrapure water was 1 minute. Drying after rinsing was carried out by blowing with nitrogen. The evaluation results are shown in Tables 7 to 12.

Compositions formed from water, water and a water-soluble solvent, water and an acid, or water and a dissociable nitrogen-containing compound (Comparative Examples 1 to 32 in Table 2) and compositions formed by adding saccharin thereto (Examples 1 to 32 in Table 1) were subjected to evaluation. In Comparative Examples 1 to 32, removal of residue was sometimes insufficient, and corrosion of an Al—Cu part of the metal wiring was observed (Table 4). On the other hand, the composition for removing photoresist residue and/or polymer residue (Examples 1 to 32) related to the present invention showed good residue removability, and the state of an Al—Cu part of the metal wiring was also good (Table 3).

It was confirmed that adding saccharin to the compositions formed from water, water and a water-soluble solvent, water and an acid, or water and a dissociable nitrogen-containing compound improved the residue removability and enhanced selectivity between removal of residue and etching of Al—Cu.

TABLE 1

Example compositions 1

| Example | Saccharin mass % | Water mass % | (A) Water-soluble solvent Compound | Mass % | (B) Acid Compound | Mass % | (C) Dissociable nitrogen-containing compound Compound | Mass % |
|---|---|---|---|---|---|---|---|---|
| 1 | 0.01 | 99.99 | | | | | | |
| 2 | 0.3 | 79.7 | Hexylene glycol | 20.0 | | | | |
| 3 | 0.3 | 79.7 | Diethylene glycol monomethyl ether | 20.0 | | | | |
| 4 | 0.3 | 94.7 | Ethyl lactate | 5.0 | | | | |
| 5 | 0.5 | 74.5 | Tetrahydrofurfuryl alcohol | 25.0 | | | | |
| 6 | 0.5 | 49.5 | Dimethyl sulfoxide | 50.0 | | | | |
| 7 | 0.3 | 79.7 | N,N-Dimethylacetamide | 20.0 | | | | |
| 8 | 0.3 | 79.7 | N-Methylpyrrolidone | 20.0 | | | | |
| 9 | 0.3 | 79.7 | Sulfolane | 20.0 | | | | |
| 10 | 0.3 | 79.7 | 1,3-dimethyl-2-imidazolidinone | 20.0 | | | | |
| 11 | 0.20 | 99.798 | | | Hydrofluoric acid | 0.002 | | |
| 12 | 0.2 | 98.8 | | | Phosphoric acid | 1.0 | | |
| 13 | 0.1 | 89.9 | | | Malonic acid | 10.0 | | |
| 14 | 0.2 | 94.8 | | | Lactic acid | 5.0 | | |
| 15 | 14.0 | 84.9 | | | | | Ammonia | 1.1 |
| 16 | 0.05 | 99.945 | | | | | Ammonium fluoride | 0.005 |
| 17 | 0.50 | 98.28 | | | | | Ammonium oxalate | 1.22 |
| 18 | 1 | 94 | | | | | Ammonium tartrate | 5 |
| 19 | 0.5 | 94.5 | | | | | Ammonium sulfate | 5.0 |
| 20 | 1.45 | 97.03 | | | | | Triammonium phosphate | 1.52 |
| 21 | 3 | 93 | | | | | Diammonium hydrogenphosphate | 4 |
| 22 | 1 | 94 | | | | | Ammonium dihydrogenphosphate | 5 |
| 23 | 2.2 | 97.3 | | | | | Piperazine | 0.5 |
| 24 | 2.9 | 96.07 | | | | | Imidazole | 1.03 |
| 25 | 3.2 | 95.8 | | | | | Monoethanolamine | 1.0 |
| 26 | 5.0 | 92.4 | | | | | Diisopropylamine | 2.6 |
| 27 | 3.5 | 92.5 | | | | | Guanidine phosphate | 4.0 |
| 28 | 0.5 | 94.5 | | | | | Triethanolamine phosphate | 5.0 |
| 29 | 1.0 | 98.1 | | | | | Piperazine phosphate | 0.9 |
| 30 | 0.3 | 94.7 | | | | | Hydroxylamine sulfate | 5.0 |
| 31 | 3 | 90 | | | | | Choline bitartrate | 7 |
| 32 | 0.01 | 94.99 | | | | | Glycine | 5.00 |

TABLE 2

Comparative example compositions 1

| Comp. Ex. | Saccharin mass % | Water mass % | (A) Water-soluble solvent Compound | Mass % | (B) Acid Compound | Mass % | (C) Dissociable nitrogen-containing compound Compound | Mass % |
|---|---|---|---|---|---|---|---|---|
| 1 |  | 100 |  |  |  |  |  |  |
| 2 |  | 80 | Hexylene glycol | 20 |  |  |  |  |
| 3 |  | 80 | Diethylene glycol monomethyl ether | 20 |  |  |  |  |
| 4 |  | 95 | Ethyl lactate | 5 |  |  |  |  |
| 5 |  | 75 | Tetrahydrofurfuryl alcohol | 25 |  |  |  |  |
| 6 |  | 50 | Dimethyl sulfoxide | 50 |  |  |  |  |
| 7 |  | 80 | N,N-Dimethylacetamide | 20 |  |  |  |  |
| 8 |  | 80 | N-Methyl-2-pyrrolidone | 20 |  |  |  |  |
| 9 |  | 80 | Sulfolane | 20 |  |  |  |  |
| 10 |  | 80 | 1,3-Dimethyl-2-imidazolidinone | 20 |  |  |  |  |
| 11 |  | 99.998 |  |  | Hydrofluoric acid | 0.002 |  |  |
| 12 |  | 99 |  |  | Phosphoric acid | 1 |  |  |
| 13 |  | 90 |  |  | Malonic acid | 10 |  |  |
| 14 |  | 95 |  |  | Lactic acid | 5 |  |  |
| 15 |  | 98.9 |  |  |  |  | Ammonia | 1.1 |
| 16 |  | 99.995 |  |  |  |  | Ammonium fluoride | 0.005 |
| 17 |  | 98.78 |  |  |  |  | Ammonium oxalate | 1.22 |
| 18 |  | 95 |  |  |  |  | Ammonium tartrate | 5 |
| 19 |  | 95.0 |  |  |  |  | Ammonium sulfate | 5.0 |
| 20 |  | 98.48 |  |  |  |  | Triammonium phosphate | 1.52 |
| 21 |  | 96 |  |  |  |  | Diammonium hydrogenphosphate | 4 |
| 22 |  | 95 |  |  |  |  | Ammonium dihydrogenphosphate | 5 |
| 23 |  | 99.5 |  |  |  |  | Piperazine | 0.5 |
| 24 |  | 98.97 |  |  |  |  | Imidazole | 1.03 |
| 25 |  | 99 |  |  |  |  | Monoethanolamine | 1 |
| 26 |  | 97.4 |  |  |  |  | Diisopropylamine | 2.6 |
| 27 |  | 96 |  |  |  |  | Guanidine phosphate | 4 |
| 28 |  | 95 |  |  |  |  | Triethanolamine phosphate | 5 |
| 29 |  | 99.1 |  |  |  |  | Piperazine phosphate | 0.9 |
| 30 |  | 95 |  |  |  |  | Hydroxylamine sulfate | 5 |
| 31 |  | 93 |  |  |  |  | Choline bitartrate | 7 |
| 32 |  | 95 |  |  |  |  | Glycine | 5 |

TABLE 3

Example composition evaluation results 1

| | | Evaluation results | | | | | |
| | | Al—Cu solid film | | Al—Cu wiring pattern | | | |
| Example | Composition pH | Treatment temperature (° C.) | Etching rate (nm/min) | Treatment temperature (° C.) | Treatment time (min) | Residue removability | Al—Cu state |
|---|---|---|---|---|---|---|---|
| 1 | 3.3 | 55 | 0.21 | 55 | 25 | ○ | ○ |
| 2 | 2.0 | 50 | 0.63 | 50 | 20 | ○ | ○ |
| 3 | 2.0 | 50 | 0.54 | 50 | 20 | ○ | ○ |
| 4 | 1.9 | 50 | 0.05 | 50 | 30 | ◎ | ○ |
| 5 | 1.8 | 50 | 0.51 | 50 | 20 | ◎ | ○ |
| 6 | 2.1 | 70 | 0.45 | 70 | 30 | ◎ | ◎ |
| 7 | 2.3 | 50 | 0.47 | 50 | 30 | ◎ | ○ |
| 8 | 2.2 | 50 | 0.43 | 50 | 30 | ◎ | ◎ |
| 9 | 1.9 | 50 | 0.79 | 50 | 30 | ○ | ○ |
| 10 | 2.0 | 50 | 0.62 | 50 | 25 | ◎ | ◎ |
| 11 | 2.0 | 25 | 1.16 | 25 | 1 | ◎ | ○ |
| 12 | 1.6 | 25 | 1.20 | 25 | 10 | ◎ | ◎ |
| 13 | 1.3 | 40 | 0.24 | 40 | 30 | ○ | ○ |
| 14 | 1.8 | 60 | 0.36 | 60 | 30 | ◎ | ○ |
| 15 | 3.4 | 70 | 0.19 | 70 | 30 | ○ | ◎ |
| 16 | 2.8 | 25 | 1.04 | 25 | 1 | ◎ | ○ |
| 17 | 4.2 | 40 | 0.22 | 40 | 25 | ◎ | ◎ |

TABLE 3-continued

Example composition evaluation results 1

Evaluation results

| | | Al—Cu solid film | | Al—Cu wiring pattern | | | |
|---|---|---|---|---|---|---|---|
| Example | Composition pH | Treatment temperature (° C.) | Etching rate (nm/min) | Treatment temperature (° C.) | Treatment time (min) | Residue removability | Al—Cu state |
| 18 | 4.6 | 70 | 0.36 | 70 | 20 | ◎ | ○ |
| 19 | 2.4 | 40 | 0.28 | 40 | 30 | ◎ | ◎ |
| 20 | 8.0 | 45 | 0.11 | 45 | 20 | ◎ | ○ |
| 21 | 6.3 | 30 | 0.40 | 30 | 20 | ◎ | ◎ |
| 22 | 2.8 | 25 | 0.35 | 25 | 15 | ◎ | ○ |
| 23 | 3.1 | 70 | 0.66 | 70 | 25 | ○ | ◎ |
| 24 | 3.0 | 70 | 0.88 | 70 | 30 | ○ | ○ |
| 25 | 3.0 | 65 | 0.41 | 65 | 30 | ◎ | ○ |
| 26 | 2.8 | 70 | 1.00 | 70 | 15 | ○ | ○ |
| 27 | 3.6 | 30 | 0.50 | 30 | 30 | ◎ | ◎ |
| 28 | 2.8 | 30 | 0.68 | 30 | 10 | ◎ | ◎ |
| 29 | 3.2 | 35 | 0.32 | 35 | 20 | ◎ | ◎ |
| 30 | 2.4 | 45 | 0.32 | 45 | 20 | ◎ | ◎ |
| 31 | 2.7 | 70 | 0.38 | 70 | 10 | ○ | ◎ |
| 32 | 5.6 | 70 | 0.41 | 70 | 30 | ○ | ◎ |

Residue removability
◎ No residue remaining at all
○ Slight amount of particulate residue remaining
Δ Some residue remaining
X Residue largely remaining
◎, ○ Pass
Δ, X Fail
Al—Cu state
◎ No Al—Cu corrosion
○ Slight amount of pitting in Al—Cu
Δ Slight amount of corrosion in Al—Cu
X Al—Cu entirely corroded
◎, ○ Pass
Δ, X Fail

TABLE 4

Comparative example composition evaluation results 1

Evaluation results

| | | Al—Cu solid film | | Al—Cu wiring pattern | | | |
|---|---|---|---|---|---|---|---|
| Comp. Ex. | Composition pH | Treatment temperature (° C.) | Etching rate (nm/min) | Treatment temperature (° C.) | Treatment time (min) | Residue removability | Al—Cu state |
| 1 | 7.0 | 55 | ≤0.05 | 55 | 25 | ○ | ◎ |
| 2 | 5.6 | 50 | 0.32 | 50 | 20 | X | ◎ |
| 3 | 5.6 | 50 | 0.08 | 50 | 20 | X | ◎ |
| 4 | 4.0 | 50 | 0.62 | 50 | 30 | ○ | X |
| 5 | 4.0 | 50 | 0.18 | 50 | 20 | X | ◎ |
| 6 | 6.8 | 70 | 0.43 | 70 | 30 | X | ◎ |
| 7 | 5.8 | 50 | 0.15 | 50 | 30 | X | ◎ |
| 8 | 4.5 | 50 | 0.05 | 50 | 30 | X | ◎ |
| 9 | 3.5 | 50 | ≤0.05 | 50 | 30 | X | ◎ |
| 10 | 6.5 | 50 | ≤0.05 | 50 | 25 | X | ◎ |
| 11 | 3.1 | 25 | 0.86 | 25 | 1 | Δ | ○ |
| 12 | 1.6 | 25 | 1.32 | 25 | 10 | Δ | ◎ |
| 13 | 1.3 | 40 | 0.36 | 40 | 30 | Δ | ◎ |
| 14 | 1.9 | 60 | 0.49 | 60 | 30 | ◎ | Δ |
| 15 | 11.7 | 70 | ≥50 | 70 | 30 | ◎ | X |
| 16 | 5.7 | 25 | 0.19 | 25 | 1 | X | ◎ |
| 17 | 6.2 | 40 | 0.28 | 40 | 25 | X | ◎ |
| 18 | 6.7 | 70 | 1.10 | 70 | 20 | X | X |
| 19 | 5.2 | 40 | ≤0.05 | 40 | 30 | X | ◎ |
| 20 | 9.1 | 45 | 0.44 | 45 | 20 | Δ | X |
| 21 | 7.9 | 30 | 0.28 | 30 | 20 | Δ | ◎ |
| 22 | 4.2 | 25 | 0.10 | 25 | 15 | Δ | ○ |
| 23 | 11.2 | 70 | ≥20 | 70 | 25 | ◎ | X |
| 24 | 9.7 | 70 | 8.84 | 70 | 30 | X | X |
| 25 | 11.3 | 65 | ≥50 | 65 | 30 | ◎ | X |

TABLE 4-continued

Comparative example composition evaluation results 1

Evaluation results

| | | Al—Cu solid film | | Al—Cu wiring pattern | | | |
|---|---|---|---|---|---|---|---|
| Comp. Ex. | Composition pH | Treatment temperature (° C.) | Etching rate (nm/min) | Treatment temperature (° C.) | Treatment time (min) | Residue removability | Al—Cu state |
| 26 | 12.1 | 70 | ≥50 | 70 | 15 | ⊚ | X |
| 27 | 8.7 | 30 | 0.09 | 30 | 30 | X | ⊚ |
| 28 | 4.3 | 30 | 0.22 | 30 | 10 | Δ | ⊚ |
| 29 | 6.3 | 35 | ≤0.05 | 35 | 20 | X | ⊚ |
| 30 | 3.6 | 45 | 0.28 | 45 | 20 | Δ | ⊚ |
| 31 | 3.5 | 70 | 0.36 | 70 | 10 | Δ | ⊚ |
| 32 | 6.2 | 70 | 0.17 | 70 | 30 | ○ | Δ |

Compositions formed from water, a water-soluble solvent, and an acid, water, a water-soluble solvent, and a dissociable nitrogen-containing compound, water, an acid, and a dissociable nitrogen-containing compound, and water, a water-soluble solvent, an acid, and a dissociable nitrogen-containing compound (Comparative Example 33 to Comparative Example 45 in Table 6) and compositions formed by adding saccharin thereto (Example 33 to Example 45 in Table 5) were subjected to evaluation. In the Comparative Examples, removal of residue was sometimes insufficient, and corrosion of an Al—Cu part of the metal wiring was observed. On the other hand, the composition for removing photoresist residue and/or polymer residue related to the present invention showed good residue removability as shown in each of the Examples, and the state of an Al—Cu part of the metal wiring was also good (Table 7 and Table 8).

TABLE 5

Example compositions 2

| | Saccharin | Water | (A) Water-soluble solvent | | (B) Acid | | (C) Dissociable nitrogen-containing compound | |
|---|---|---|---|---|---|---|---|---|
| Example | mass % | mass % | Compound | Mass % | Compound | Mass % | Compound | Mass % |
| 33 | 0.5 | 64.5 | N-Methyl-2-pyrrolidone | 24.0 | Malonic acid | 10.0 | Iminodiacetic acid | 1.0 |
| 34 | 0.10 | 84.89 | Tripropylene glycol monomethyl ether | 15.00 | | | Ammonium fluoride | 0.01 |
| 35 | 0.10 | 89.89 | Ethyl lactate | 10.00 | | | Ammonium fluoride | 0.01 |
| 36 | 0.10 | 69.89 | Propylene glycol | 30.00 | | | Ammonium fluoride | 0.01 |
| 37 | 0.10 | 69.79 | Propylene glycol | 30.00 | | | Ammonium fluoride Glycine | 0.01 0.1 |
| 38 | 0.8 | 60.0 | Diethylene glycol monobutyl ether | 30.0 | Oxalic acid D-Sorbitol | 0.2 5.0 | Ammonium sulfate | 4.0 |
| 39 | 0.5 | 79.5 | Propylene glycol | 15.0 | | | Ammonium sulfate | 5.0 |
| 40 | 0.4 | 89.4 | Diethylene glycol monomethyl ether | 9.0 | | | Ammonium oxalate | 1.2 |
| 41 | 0.6 | 96.4 | | | | | Ammonium oxalate Glycine | 2 1 |
| 42 | 0.6 | 87.4 | Diethylene glycol monobutyl ether | 9.0 | | | Ammonium oxalate Glycine | 2.0 1.0 |
| 43 | 0.50 | 96.28 | | | | | Ammonium oxalate Dihydroxyethylglycine | 1.22 2.00 |
| 44 | 0.50 | 93.28 | Diethylene glycol monobutyl ether | 3.00 | | | Ammonium oxalate Imidazole | 1.22 2.00 |
| 45 | 1.60 | 91.88 | N,N-Dimethylacetamide | 5.00 | | | Triammonium phosphate | 1.52 |

TABLE 6

Comparative example compositions 2

| | Saccharin | Water | (A) Water-soluble solvent | | (B) Acid | | (C) Dissociable nitrogen-containing compound | |
|---|---|---|---|---|---|---|---|---|
| Comp. Ex. | mass % | mass % | Compound | Mass % | Compound | Mass % | Compound | Mass % |
| 33 | | 65 | N-Methyl-2-pyrrolidone | 24 | Malonic acid | 10 | Iminodiacetic acid | 1 |
| 34 | | 84.99 | Tripropylene glycol monomethyl ether | 15.00 | | | Ammonium fluoride | 0.01 |

TABLE 6-continued

Comparative example compositions 2

| Comp. Ex. | Saccharin mass % | Water mass % | (A)Water-soluble solvent Compound | Mass % | (B) Acid Compound | Mass % | (C) Dissociable nitrogen-containing compound Compound | Mass % |
|---|---|---|---|---|---|---|---|---|
| 35 | | 89.99 | Ethyl lactate | 10.00 | | | Ammonium fluoride | 0.01 |
| 36 | | 69.99 | Propylene glycol | 30.00 | | | Ammonium fluoride | 0.01 |
| 37 | | 69.89 | Propylene glycol | 30.00 | | | Ammonium fluoride | 0.01 |
| | | | | | | | Glycine | 0.1 |
| 38 | | 60.8 | Diethylene glycol monobutyl ether | 30.0 | Oxalic acid D-Sorbitol | 0.2 5.0 | Ammonium sulfate | 4.0 |
| 39 | | 80 | Propylene glycol | 15 | | | Ammonium sulfate | 5 |
| 40 | | 89.8 | Diethylene glycol monomethyl ether | 9.0 | | | Ammonium oxalate | 1.2 |
| 41 | | 97 | | | | | Ammonium oxalate | 2 |
| | | | | | | | Glycine | 1 |
| 42 | | 88 | Diethylene glycol monobutyl ether | 9 | | | Ammonium oxalate | 2 |
| | | | | | | | Glycine | 1 |
| 43 | | 96.78 | | | | | Ammonium oxalate | 1.22 |
| | | | | | | | Dihydroxyethyl glycine | 2.00 |
| 44 | | 93.78 | Diethylene glycol monobutyl ether | 3.00 | | | Ammonium oxalate | 1.22 |
| | | | | | | | Imidazole | 2.00 |
| 45 | | 93.48 | N,N-Dimethylacetamide | 5.00 | | | Triammonium phosphate | 1.52 |

TABLE 7

Example composition evaluation results 2

| | | Evaluation results | | | | | |
|---|---|---|---|---|---|---|---|
| | | Al—Cu solid film | | Al—Cu wiring pattern | | | |
| Example | Composition pH | Treatment temperature (° C.) | Etching rate (nm/min) | Treatment temperature (° C.) | Treatment time (min) | Residue removability | Al—Cu state |
| 33 | 1.7 | 50 | 0.23 | 50 | 30 | ◉ | ◉ |
| 34 | 2.6 | 25 | 1.15 | 25 | 0.5 | ◉ | ○ |
| 35 | 2.2 | 25 | 1.96 | 25 | 0.5 | ◉ | ○ |
| 36 | 2.5 | 25 | 1.03 | 25 | 0.5 | ◉ | ◉ |
| 37 | 3.1 | 25 | 0.87 | 25 | 0.5 | ◉ | ◉ |
| 38 | 2.2 | 35 | ≤0.05 | 35 | 30 | ◉ | ◉ |
| 39 | 2.6 | 45 | 0.63 | 45 | 30 | ◉ | ○ |
| 40 | 4.5 | 45 | 0.44 | 45 | 25 | ◉ | ◉ |
| 41 | 4.3 | 45 | 0.21 | 45 | 25 | ◉ | ◉ |
| 42 | 4.5 | 45 | 0.18 | 45 | 25 | ◉ | ◉ |
| 43 | 4.2 | 40 | 0.13 | 40 | 25 | ◉ | ◉ |
| 44 | 8.1 | 35 | 0.98 | 35 | 15 | ◉ | ◉ |
| 45 | 7.8 | 45 | 0.09 | 45 | 20 | ◉ | ◉ |

TABLE 8

Comparative example composition evaluation results 2

| | | Evaluation results | | | | | |
|---|---|---|---|---|---|---|---|
| | | Al—Cu solid film | | Al—Cu wiring pattern | | | |
| Comp. Ex. | Composition pH | Treatment temperature (° C.) | Etching rate (nm/min) | Treatment temperature (° C.) | Treatment time (min) | Residue removability | Al—Cu state |
| 33 | 1.8 | 50 | 0.24 | 50 | 30 | Δ | Δ |
| 34 | 4.1 | 25 | 0.56 | 25 | 0.5 | X | ○ |
| 35 | 3.3 | 25 | 0.93 | 25 | 0.5 | X | ○ |
| 36 | 6.1 | 25 | 0.08 | 25 | 0.5 | X | ◉ |
| 37 | 6.1 | 25 | 0.14 | 25 | 0.5 | X | ◉ |
| 38 | 2.6 | 35 | ≤0.05 | 35 | 30 | Δ | ◉ |
| 39 | 5.3 | 45 | ≤0.05 | 45 | 30 | X | ◉ |
| 40 | 6.3 | 45 | 0.57 | 45 | 25 | Δ | ◉ |
| 41 | 6.1 | 45 | 0.34 | 45 | 25 | Δ | ◉ |

TABLE 8-continued

Comparative example composition evaluation results 2

Evaluation results

| | | Al—Cu solid film | | Al—Cu wiring pattern | | | |
|---|---|---|---|---|---|---|---|
| Comp. Ex. | Composition pH | Treatment temperature (° C.) | Etching rate (nm/min) | Treatment temperature (° C.) | Treatment time (min) | Residue removability | Al—Cu state |
| 42 | 6.3 | 45 | 0.33 | 45 | 25 | Δ | ○ |
| 43 | 5.6 | 40 | 0.12 | 40 | 25 | Δ | ◎ |
| 44 | 8.4 | 35 | 1.84 | 35 | 15 | ⊚ | X |
| 45 | 9.0 | 45 | 0.39 | 45 | 20 | ⊚ | X |

As an active ingredient of a conventional composition for removing photoresist residue and/or polymer residue there can be cited a fluorine compound such as hydrofluoric acid or ammonium fluoride, a phenol represented by catechol, an amino acid such as glycine or iminodiacetic acid, an amine such as triethanolamine, phosphoric acid, and an organic acid such as acetic acid. Conventional compositions for removing photoresist residue and/or polymer residue containing the above active ingredients (Comparative Examples 46 to 63 in Table 10) and compositions formed by adding saccharin instead of the active ingredient to the conventional compositions for removing photoresist residue and/or polymer residue (Examples 46 to 56 in Table 9) were subjected to evaluation, and the effect of the active ingredient in the conventional compositions and the effect of saccharin were compared. In Comparative Examples 46 to 63, removal of residue was sometimes insufficient, and corrosion of an Al—Cu part of metal wiring was observed (Table 12). On the other hand, the compositions for removing photoresist residue and/or polymer residue related to the present invention (Examples 46 to 56) showed good residue removability, and the state of an Al—Cu part the metal wiring was also good (Table 11). It was confirmed that saccharin exhibited superior effects to those of the active ingredient for the conventional compositions for removing photoresist residue and/or polymer residue.

TABLE 9

Example compositions 3

| | Saccharin | Water | (A) Water-soluble solvent | | (B) Acid | | (C) Dissociable nitrogen-containing compound | |
|---|---|---|---|---|---|---|---|---|
| Example | mass % | mass % | Compound | Mass % | Compound | Mass % | Compound | Mass % |
| 46 | 0.3 | 79.7 | Hexylene glycol | 20.0 | | | | |
| 47 | 0.3 | 79.7 | Diethylene glycol monomethyl ether | 20.0 | | | | |
| 48 | 0.3 | 94.7 | Ethyl lactate | 5.0 | | | | |
| 49 | 0.5 | 74.5 | Tetrahydrofurfuryl alcohol | 25.0 | | | | |
| 50 | 0.1 | 89.9 | | | Malonic acid | 10.0 | | |
| 51 | 0.10 | 99.89 | | | | | Ammonium fluoride | 0.01 |
| 52 | 1.45 | 97.03 | | | | | Triammonium phosphate | 1.52 |
| 53 | 2.00 | 96.48 | | | | | Triammonium phosphate | 1.52 |
| 54 | 3.42 | 95.06 | | | | | Triammonium phosphate | 1.52 |
| 55 | 12 | 80 | | | | | Triammonium phosphate | 8 |
| 56 | 3.2 | 95.8 | | | | | Monoethanolamine | 1.0 |

TABLE 10

Comparative example compositions 3

| | Saccharin | Water | (A) Water-soluble solvent | | (B) Acid | | (C) Dissociable nitrogen-containing compound | |
|---|---|---|---|---|---|---|---|---|
| Comp. Ex. | mass % | mass % | Compound | Mass % | Compound | Mass % | Compound | Mass % |
| 46 | | 79.7 | Hexylene glycol | 20.0 | Hydrofluoric acid | 0.3 | | |
| 47 | | 79.7 | Diethylene glycol monomethyl ether | 20.0 | Catechol | 0.3 | | |
| 48 | | 79.7 | Diethylene glycol monomethyl ether | 20.0 | | | Ammonium fluoride | 0.3 |

TABLE 10-continued

Comparative example compositions 3

| Comp. Ex. | Saccharin mass % | Water mass % | (A) Water-soluble solvent Compound | Mass % | (B) Acid Compound | Mass % | (C) Dissociable nitrogen-containing compound Compound | Mass % |
|---|---|---|---|---|---|---|---|---|
| 49 | | 79.7 | Ethyl lactate | 20.0 | Phosphoric acid | 0.3 | | |
| 50 | | 94.7 | Ethyl lactate | 5.0 | | | Ammonium fluoride | 0.3 |
| 51 | | 74.5 | Tetrahydrofurfuryl alcohol | 25.0 | | | Glycine | 0.5 |
| 52 | | 89.9 | | | Malonic acid | 10.0 | Iminodiacetic acid | 0.1 |
| 53 | | 89.9 | | | Malonic acid | 10.0 | Glycine | 0.1 |
| 54 | | 99.89 | | | Catechol | 0.10 | Ammonium fluoride | 0.01 |
| 55 | | 99.89 | | | | | Ammonium fluoride Glycine | 0.01 0.10 |
| 56 | | 99.89 | | | | | Ammonium fluoride Triethanolamine | 0.01 0.10 |
| 57 | | 98.01 | | | Phosphoric acid | 0.47 | Triammonium phosphate | 1.52 |
| 58 | | 97.75 | | | Phosphoric acid | 0.73 | Triammonium phosphate | 1.52 |
| 59 | | 96.69 | | | Phosphoric acid | 1.79 | Triammonium phosphate | 1.52 |
| 60 | | 80 | | | Nitrotri(methylene) trisphosphonic acid | 12 | Triammonium phosphate | 8 |
| 61 | | 98.5 | | | Acetic acid | 0.5 | Monoethanolamine | 1.0 |
| 62 | | 95.8 | | | Acetic acid | 3.2 | Monoethanolamine | 1.0 |
| 63 | | 95.8 | | | Phosphoric acid | 3.2 | Monoethanolamine | 1.0 |

TABLE 11

Example composition evaluation results 3

| | | Al—Cu solid film | | Al—Cu wiring pattern | | | |
|---|---|---|---|---|---|---|---|
| Example | Composition pH | Treatment temperature (° C.) | Etching rate (nm/min) | Treatment temperature (° C.) | Treatment time (min) | Residue removability | Al—Cu state |
| 46 | 2.0 | 50 | 0.63 | 50 | 20 | ○ | ○ |
| 47 | 2.0 | 50 | 0.54 | 50 | 20 | ○ | ○ |
| 48 | 1.9 | 50 | 0.05 | 50 | 30 | ⊙ | ○ |
| 49 | 1.8 | 50 | 0.51 | 50 | 20 | ⊙ | ○ |
| 50 | 1.3 | 40 | 0.24 | 40 | 30 | ○ | ⊙ |
| 51 | 2.6 | 25 | 2.54 | 25 | 0.5 | ⊙ | ⊙ |
| 52 | 8.0 | 45 | 0.11 | 45 | 20 | ⊙ | ○ |
| 53 | 7.0 | 45 | 0.13 | 45 | 20 | ⊙ | ⊙ |
| 54 | 4.5 | 45 | 0.06 | 45 | 20 | ⊙ | ⊙ |
| 55 | 6.6 | 30 | 0.89 | 30 | 10 | ⊙ | ⊙ |
| 56 | 3.0 | 65 | 0.41 | 65 | 30 | ⊙ | ○ |

TABLE 12

Comparative example composition evaluation results 3

| | | Al—Cu solid film | | Al—Cu wiring pattern | | | |
|---|---|---|---|---|---|---|---|
| Comp. Ex. | Composition pH | Treatment temperature (° C.) | Etching rate (nm/min) | Treatment temperature (° C.) | Treatment time (min) | Residue removability | Al—Cu state |
| 46 | 2.6 | 50 | ≥50 | 50 | 20 | ⊙ | X |
| 47 | 5.2 | 50 | 0.31 | 50 | 20 | Δ | ⊙ |
| 48 | 6.5 | 50 | 22.50 | 50 | 20 | ⊙ | X |
| 49 | 2.0 | 50 | 4.28 | 50 | 30 | ⊙ | X |

TABLE 12-continued

Comparative example composition evaluation results 3

Evaluation results

| | | Al—Cu solid film | | Al—Cu wiring pattern | | | |
| --- | --- | --- | --- | --- | --- | --- | --- |
| Comp. Ex. | Composition pH | Treatment temperature (° C.) | Etching rate (nm/min) | Treatment temperature (° C.) | Treatment time (min) | Residue removability | Al—Cu state |
| 50 | 5.4 | 50 | 17.84 | 50 | 30 | ⊚ | X |
| 51 | 4.9 | 50 | 0.07 | 50 | 20 | X | ⊚ |
| 52 | 1.3 | 40 | 0.31 | 40 | 30 | Δ | ⊚ |
| 53 | 1.4 | 40 | 0.11 | 40 | 30 | Δ | ⊚ |
| 54 | 5.6 | 25 | 1.08 | 25 | 0.5 | X | ⊚ |
| 55 | 5.9 | 25 | 0.20 | 25 | 0.5 | X | ⊚ |
| 56 | 8.8 | 25 | 0.78 | 25 | 0.5 | X | ⊚ |
| 57 | 8.0 | 45 | 0.26 | 45 | 20 | ⊚ | X |
| 58 | 7.1 | 45 | 0.36 | 45 | 20 | ⊚ | X |
| 59 | 4.5 | 45 | 0.25 | 45 | 20 | ⊚ | X |
| 60 | 3.7 | 30 | 0.32 | 30 | 10 | X | ⊚ |
| 61 | 9.5 | 65 | ≥30 | 65 | 30 | ⊚ | X |
| 62 | 4.3 | 65 | 1.44 | 65 | 30 | ⊚ | X |
| 63 | 1.9 | 65 | 14.29 | 65 | 30 | ⊚ | X |

An aqueous solution formed from triammonium phosphate and ammonia (Comparative Example 64, pH 9.8), a composition formed from triammonium phosphate, saccharin, and water (Example 57, pH 8.9), and a composition formed from triammonium phosphate, ammonia, saccharin, and water (Example 58, pH 9.0) were subjected to evaluation. The composition formed from triammonium phosphate, saccharin, and water (Example 57), whose pH was 8.9, gave good results. The composition formed from triammonium phosphate, ammonia, saccharin, and water (Example 58), whose pH was 9.0, gave similarly good results. On the other hand, with the composition formed from triammonium phosphate, ammonia, saccharin, and water (Comparative Example 64), whose pH was 9.8, Al—Cu was corroded, and the residue removability was insufficient.

TABLE 13

Example composition 4

| | Saccharin | Water | (A) Water-soluble solvent | | (B) Acid | | (C) Dissociable nitrogen-containing compound | |
| --- | --- | --- | --- | --- | --- | --- | --- | --- |
| Example | mass % | mass % | Compound | Mass % | Compound | Mass % | Compound | Mass % |
| 57 | 0.50 | 97.98 | | | | | Triammonium phosphate | 1.52 |
| 58 | 0.50 | 97.96 | | | | | Triammonium phosphate | 1.52 |
| | | | | | | | Ammonia | 0.02 |

TABLE 14

Comparative example compositions 4

| | Saccharin | Water | A) Water-soluble solvent | | (B) Acid | | (C) Dissociable nitrogen-containing compound | |
| --- | --- | --- | --- | --- | --- | --- | --- | --- |
| Comp. Ex. | mass % | mass % | Compound | Mass % | Compound | Mass % | Compound | Mass % |
| 64 | 0.50 | 97.41 | | | | | Triammonium phosphate | 1.52 |
| | | | | | | | Ammonia | 0.57 |

TABLE 15

Example composition evaluation results 4

| | | Evaluation results | | | | | |
|---|---|---|---|---|---|---|---|
| | | Al—Cu solid film | | Al—Cu wiring pattern | | | |
| Example | Composition pH | Treatment temperature (° C.) | Etching rate (nm/min) | Treatment temperature (° C.) | Treatment time (min) | Residue removability | Al—Cu state |
| 57 | 8.9 | 40 | 0.18 | 40 | 30 | ○ | ◎ |
| 58 | 9.0 | 40 | 0.22 | 40 | 30 | ○ | ◎ |

TABLE 16

Comparative example composition evaluation results 4

| | | Evaluation results | | | | | |
|---|---|---|---|---|---|---|---|
| | | Al—Cu solid film | | Al—Cu wiring pattern | | | |
| Comp. Ex. | Composition pH | Treatment temperature (° C.) | Etching rate (nm/min) | Treatment temperature (° C.) | Treatment time (min) | Residue removability | Al—Cu state |
| 64 | 9.8 | 40 | 2.09 | 40 | 30 | Δ | X |

An aqueous solution formed from propylene carbonate, hydrofluoric acid, and water (Comparative Example 65) and a composition formed from propylene carbonate, hydrofluoric acid, water, and saccharin (Example 59) were subjected to evaluation at low pH. The actual etching rate of Example 59 was 0.01 to 0.02 nm/min and the actual etching rate of Comparative Example 65 was 0.04 nm/min, and a decrease in the etching rate due to the addition of saccharin, that is, an improvement in the inhibition of corrosion of Al—Cu, was observed. Furthermore, it was observed that the residue removability improved and the selectivity between removal of residue and etching of Al—Cu was improved.

TABLE 17

Example composition 5

| | Saccharin | Water | (A) Water-soluble solvent | | (B) Acid | | (C) Dissociable nitrogen-containing compound | |
|---|---|---|---|---|---|---|---|---|
| Example | mass % | mass % | Compound | Mass % | Compound | Mass % | Compound | Mass % |
| 59 | 1 | 1 | Propylene carbonate | 97 | Hydrofluoric acid | 1 | | |

TABLE 18

Comparative example composition 5

| | Saccharin | Water | A) Water-soluble solvent | | (B) Acid | | (C) Dissociable nitrogen-containing compound | |
|---|---|---|---|---|---|---|---|---|
| Comp. Ex. | mass % | mass % | Compound | Mass % | Compound | Mass % | Compound | Mass % |
| 65 | | 1 | Propylene carbonate | 98 | Hydrofluoric acid | 1 | | |

TABLE 19

Example composition evaluation results 5

| | | Al—Cu solid film | | Al—Cu wiring pattern | | | |
|---|---|---|---|---|---|---|---|
| Example | Composition pH | Treatment temperature (° C.) | Etching rate (nm/min) | Treatment temperature (° C.) | Treatment time (Sec) | Residue removability | Al—Cu state |
| 59 | 0.1 | 25 | ≤0.05 | 25 | 10 | ○ | ⊚ |

TABLE 20

Comparative example composition evaluation results 5

| | | Al—Cu solid film | | Al—Cu wiring pattern | | | |
|---|---|---|---|---|---|---|---|
| Comp. Ex. | Composition pH | Treatment temperature (° C.) | Etching rate (nm/min) | Treatment temperature (° C.) | Treatment time (Sec) | Residue removability | Al—Cu state |
| 65 | 0.1 | 25 | ≤0.05 | 25 | 10 | Δ | ⊚ |

The invention claimed is:

1. A composition for removing photoresist residue and/or polymer residue after dry etching or wet etching using a photoresist as a mask, the composition consisting of saccharin; water; and two or more types of substance selected from the group consisting of (A) a water-soluble solvent, (B) an acid, and (C) a dissociable nitrogen-containing compound; and the pH being no greater than 9.7; and wherein the composition comprises neither fluorine compounds, hydroxylamine compounds, hydrochloric acid, nor sulfuric acid.

2. The composition according to claim 1, wherein the content of saccharin is at least 0.01 mass %.

3. A method for removing photoresist residue and/or polymer residue, the method employing the composition according to claim 1.

4. A method for producing a semiconductor circuit element having metal wiring, the method comprising a step of removing photoresist residue and/or polymer residue remaining on a metal wiring-forming structure using the composition according to claim 1.

5. A semiconductor circuit element produced by the method according to claim 4.

6. A composition for removing photoresist residue and/or polymer residue after dry etching or wet etching using a photoresist as a mask, the composition consisting of saccharin; water; two or more types of substance selected from the group consisting of (A) a water-soluble solvent, (B) an acid, and (C) a dissociable nitrogen-containing compound; and one or more types of substance selected from the group consisting of (D) a cationic, anionic, or nonionic surfactant, and (E) D-sorbitol; and the pH being no greater than 9.7; and wherein the composition comprises neither fluorine compounds, hydroxylamine compounds, hydrochloric acid, nor sulfuric acid.

7. The composition according to claim 6, wherein the content of saccharin is at least 0.01 mass %.

8. A method for removing photoresist residue and/or polymer residue, the method employing the composition according to claim 6.

9. A method for producing a semiconductor circuit element having metal wiring, the method comprising a step of removing photoresist residue and/or polymer residue remaining on a metal wiring-forming structure using the composition according to claim 6.

10. A semiconductor circuit element produced by the method according to claim 9.

* * * * *